United States Patent [19]

Catlin

[11] Patent Number: 4,916,647
[45] Date of Patent: Apr. 10, 1990

[54] HARDWIRED PIPELINE PROCESSOR FOR LOGIC SIMULATION

[75] Inventor: Gary M. Catlin, Cupertino, Calif.

[73] Assignee: Daisy Systems Corporation, Mountain View, Calif.

[21] Appl. No.: 67,634

[22] Filed: Jun. 26, 1987

[51] Int. Cl.⁴ .................. G06F 15/16; G06F 15/60
[52] U.S. Cl. .................. 364/578; 364/221.2; 364/264.3
[58] Field of Search .......... 364/200, 900, 578; 371/23

[56] References Cited

U.S. PATENT DOCUMENTS

| | | | |
|---|---|---|---|
| 3,701,976 | 10/1972 | Shively | 340/172.5 |
| 4,123,794 | 10/1978 | Matsumoto | 364/132 |
| 4,306,286 | 12/1981 | Cocke et al. | 364/200 |
| 4,334,305 | 6/1982 | Girardi | 370/86 |
| 4,335,426 | 6/1982 | Maxwell et al. | 364/200 |
| 4,339,793 | 7/1982 | Marenin | 364/200 |
| 4,347,564 | 8/1982 | Sugano et al. | 364/132 |
| 4,351,025 | 9/1982 | Hall, Jr. | 364/200 |
| 4,365,297 | 12/1982 | Grisham, Jr. | 364/200 |
| 4,396,978 | 8/1983 | Hammer et al. | 364/200 |
| 4,412,303 | 10/1983 | Barnes et al. | 364/900 |
| 4,466,063 | 8/1984 | Segarra et al. | 364/200 |
| 4,468,734 | 8/1984 | Lanier et al. | 364/200 |
| 4,527,249 | 7/1985 | Van Brunt | 364/578 |
| 4,594,655 | 6/1986 | Hao et al. | 364/200 |
| 4,602,365 | 7/1986 | White et al. | 370/89 |
| 4,622,550 | 11/1986 | O'Connor et al. | 340/825.05 |
| 4,697,241 | 9/1987 | Lavi | 364/900 |
| 4,700,292 | 10/1987 | Campanini | 364/200 |
| 4,725,975 | 2/1988 | Sasaki | 364/900 |
| 4,751,637 | 6/1988 | Catlin | 364/200 |

FOREIGN PATENT DOCUMENTS

| | | |
|---|---|---|
| 0021404 | 7/1981 | European Pat. Off. . |
| 2096369 | 10/1982 | United Kingdom . |
| 2156550A | 10/1985 | United Kingdom . |
| 81/01066 | 4/1981 | World Int. Prop. O. . |

OTHER PUBLICATIONS

Abramovici et al., "A Logic Simulation Machine," IEEE Trans. on Computer-Aided Design of Integrated Circuits and Systems, vol. CAD-2, No. 2, Apr. 1983, pp. 82-94.
"ZYCAD Logic Evaluator," Nov. 1982.
Howard et al., "Parallel Processing Interactively Simulates Complex VLSI Logic," Electronics, Dec. 1985, pp. 147-150.

Primary Examiner—Parshotam S. Lall
Assistant Examiner—Christopher L. Makay
Attorney, Agent, or Firm—Blakely, Sokoloff, Taylor & Zafman

[57] ABSTRACT

Computer for implementing an event driven algorithm which utilizes a master processor and a plurality of processors arranged in modules, wherein the processors within the module are capable of operating independently of each other. The various modules are also capable of operating independently of each other and communicate with each other and the host unit by a unidirectional token ring bus. A specialized hardwired processor design is implemented to provide a pipelined flow of data to provide a more rapid algorithm simulation.

7 Claims, 5 Drawing Sheets

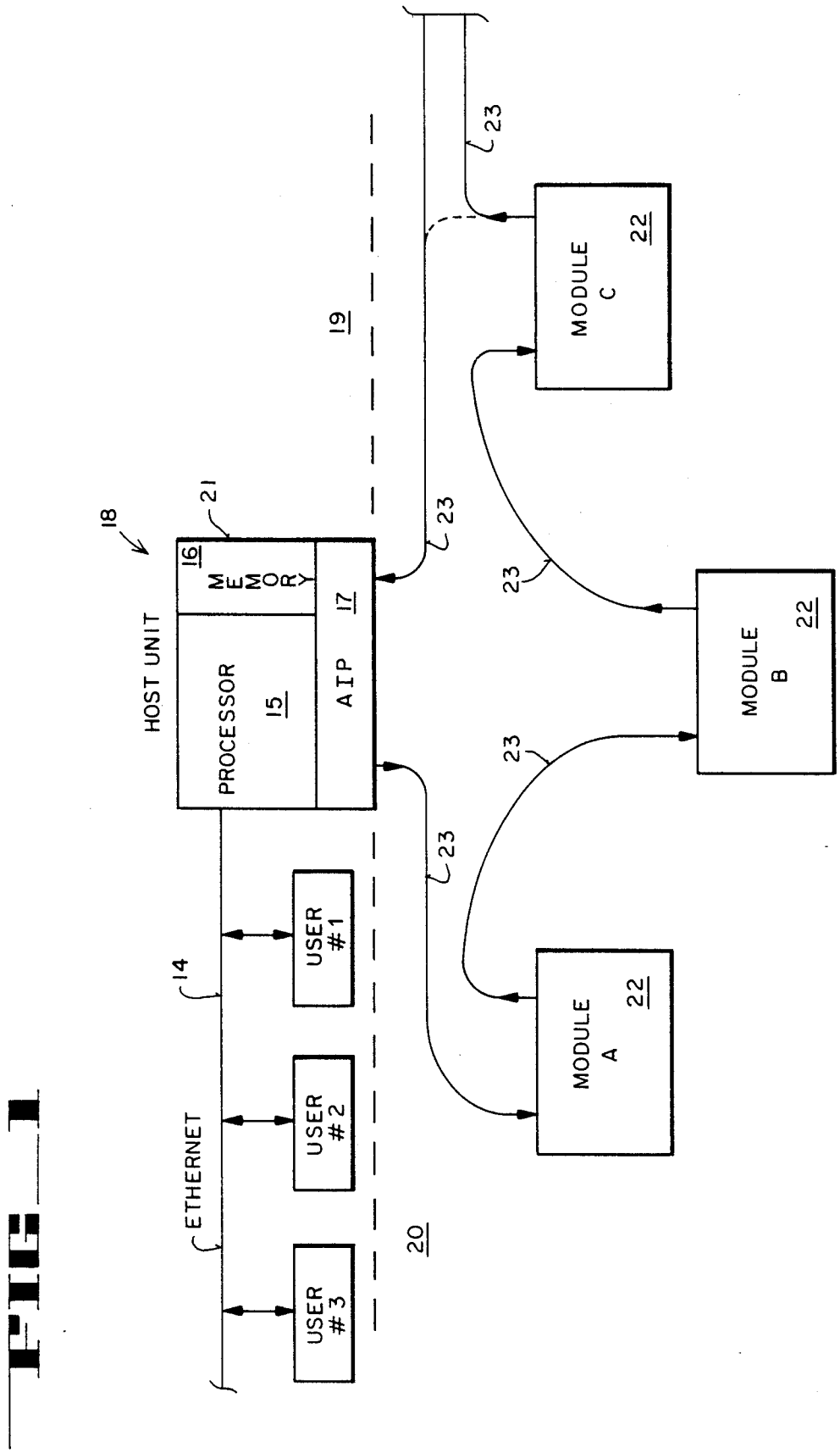

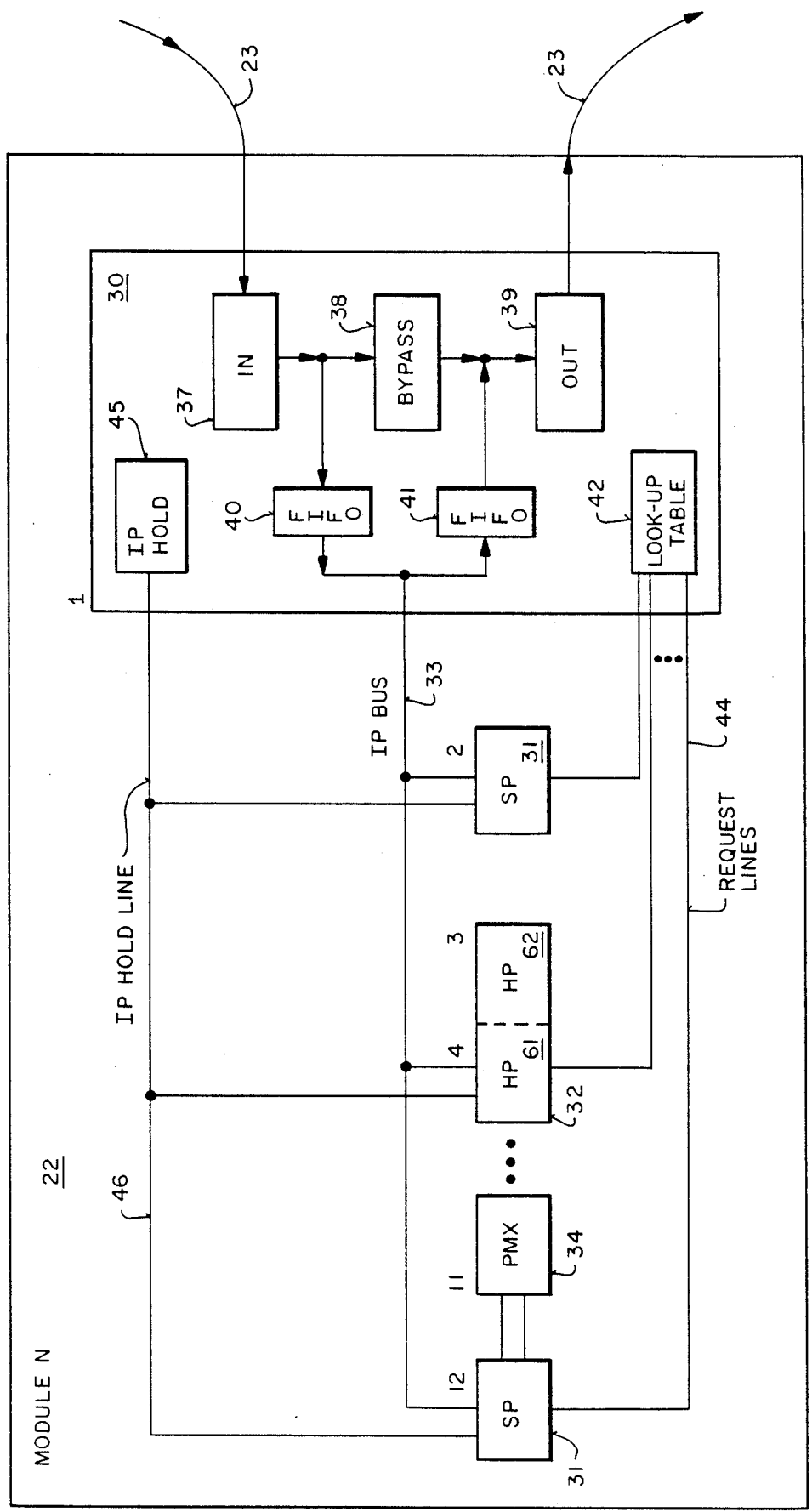
FIG_2

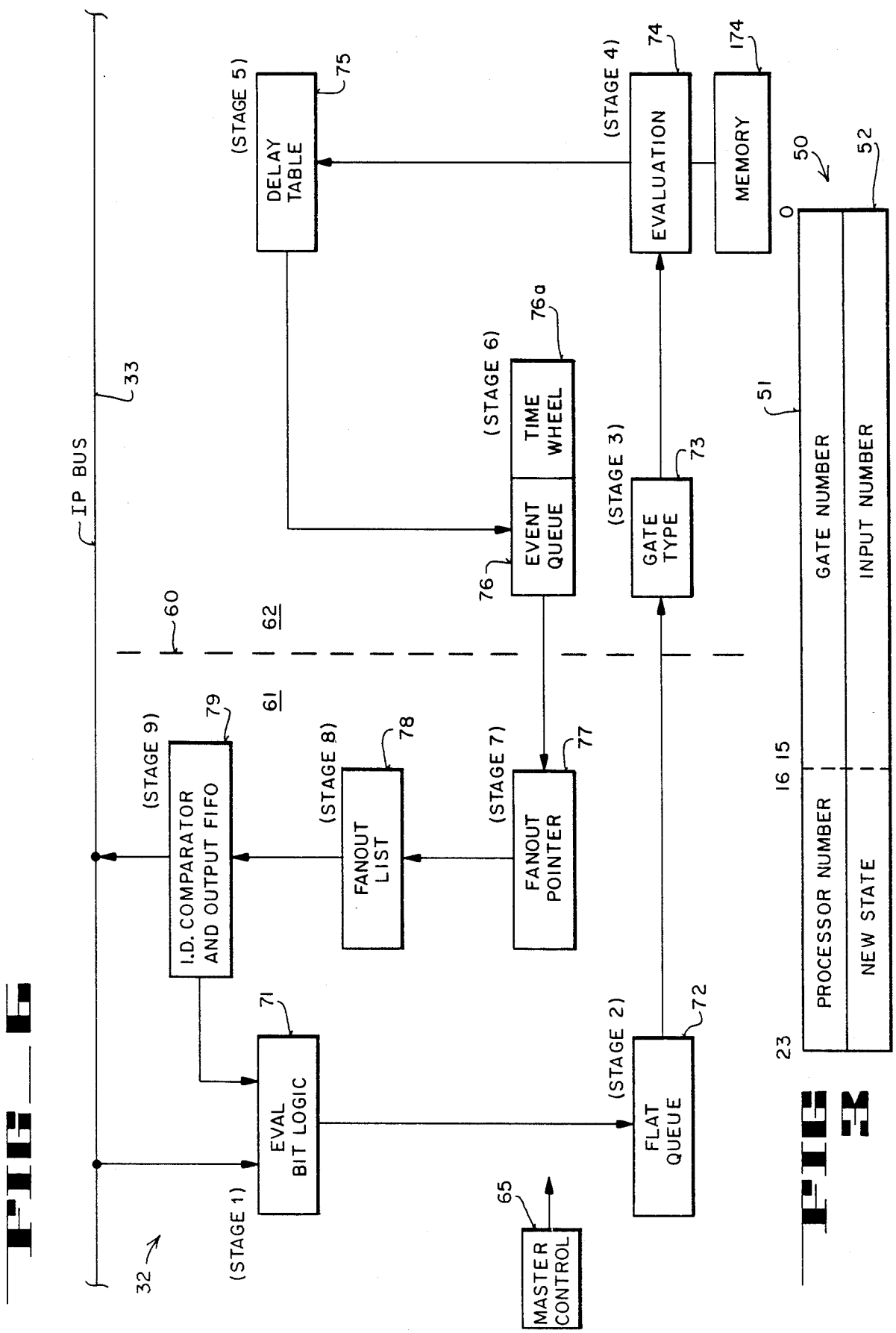

FIG_4
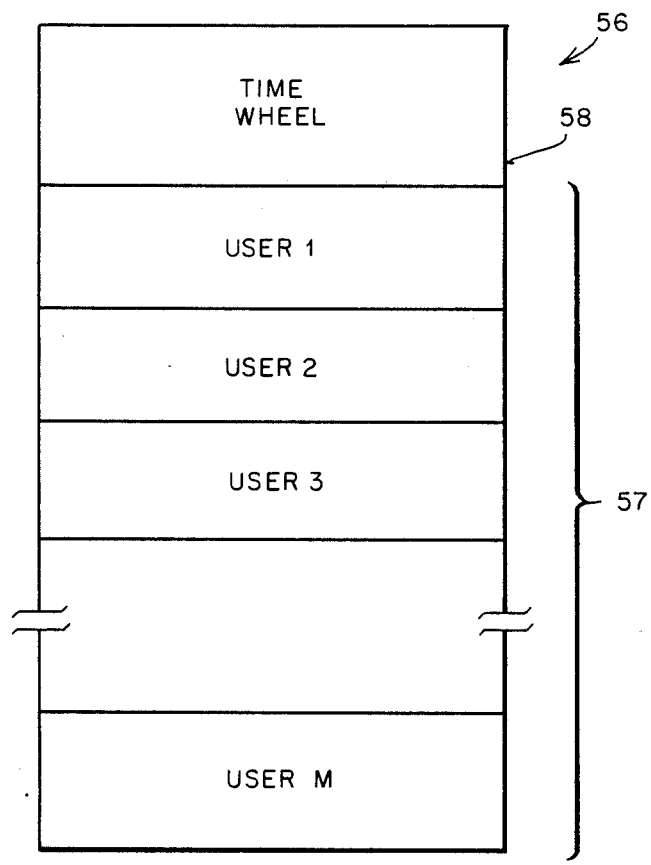
FIG_5
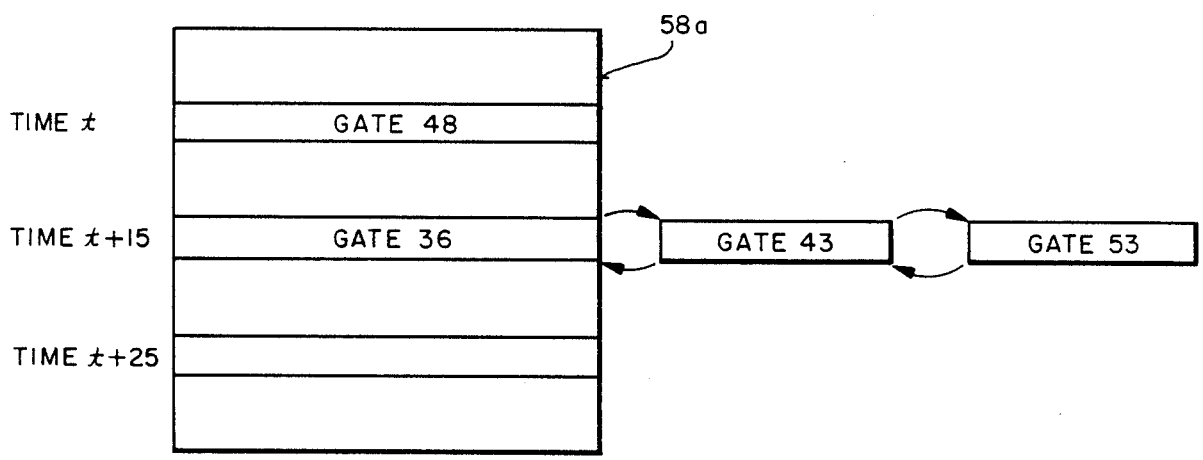

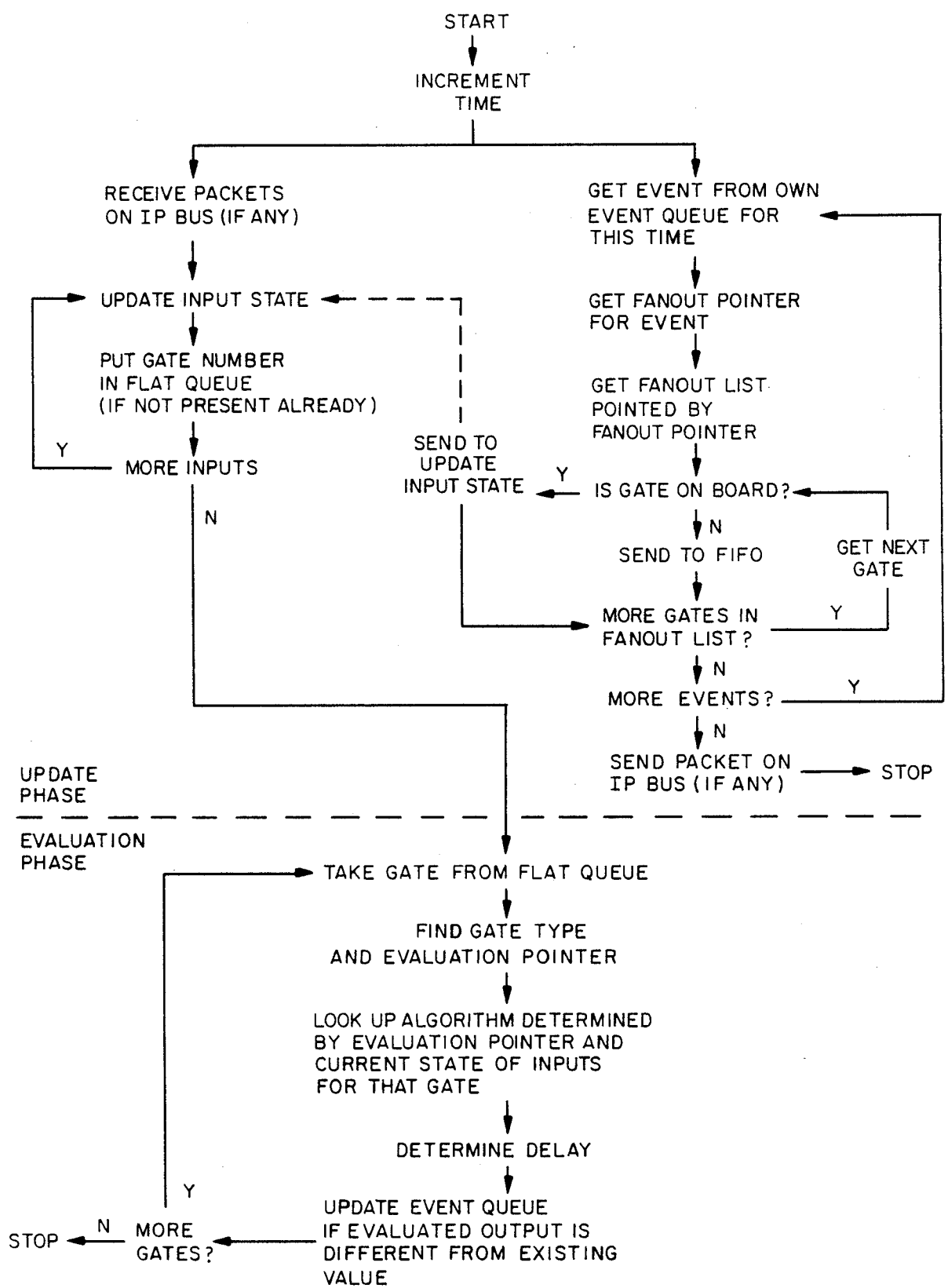
FIG_7

HARDWIRED PIPELINE PROCESSOR FOR LOGIC SIMULATION

CROSS REFERENCE TO RELATED APPLICATIONS

The present application is related to U.S. patent application Ser. No. 067,633, filed June 26, 1987. The present application is also related to U.S. patent application Ser. No. 142,721, filed Jan. 11, 1988, which is a continuation-in-part of application Ser. No. 067,633, filed June 26, 1987.

BACKGROUND OF THE INVENTION

1. Field of the Invention

The invention relates to the field of computer-aided design and more particularly to computer-aided design systems using event driven simulation algorithms.

2. Prior Art

Computer-aided design has become a commonly used tool in the design of complex electrical designs. Computer-aided design work stations are almost a necessity in designing high density electrical circuits and semiconductor device layouts. These computer-aided design work stations not only provide a design tool but are capable of providing diagnostics to verify design errors quickly.

Typically, the more advanced computer-aided design work stations for circuit simulation are capable of simulating circuits having over a million components. Instead of evaluating every input and output, event driven algorithms evaluate only those inputs and outputs which change their states from one time period to the next. One such digital computer system which implements an event driven simulation algorithm is described in U.S. patent application Ser. No. 594,533; filed Mar. 28, 1984; entitled Digital Computer for Implementing Event Driven Simulation Algorithm; which issued as U.S. Pat. No. 4,751,637 on June 14, 1988; and is implemented in a work station commercially available and sold under the trademark "MEGALOGICIAN" by Daisy Systems Corporation of Mountain View, Calif. However, this prior art system utilizes a microcodable simulation processor which tend to limit the processing speed capability due to a single ALU used with each processor.

The present invention implements an event driven simulation algorithm by utilizing a more complex architecture which permits a large number of processors to operate simultaneously in parallel, as well as a new streamlined hardwired processor, for providing design capability at a much faster pace.

Prior art references known to the Applicant which disclose special purpose computers for implementing simulation algorithms are:

(i) "A Logic Simulation Machine" by Abramovici, M. Et Al, *IEE Transactions on Computer-Aided Design of Integrated Circuits and Systems* Vol. CAD-2, No. 2, April 1983. The present invention implements an algorithm similar to that described in this article. However, the partitioning used in the present invention is substantially different than that discussed in the article.

(ii) "ZYCAD Logic Evaluator" as described in ZYCAD Corporation's manual dated November 1982. This apparatus employs different partitioning than the present invention. Moreover, it does not offer the flexibility of the presently described invention where the compute is microcode programmable.

(iii) "Parallel Processing Interactively Simulates Complex VSLI Logic" by Howard, J. Et Al, *Electronics* Dec. 15, 1983, beginning at p. 147. This article describes the implementation of a different algorithm which is not event driven. Different architecture and partitioning are employed. (Applicant does not concede that this particular article is prior art, however, Applicant believes that there are prior art computers employing the teachings of this article.)

(iv) U.S. Pat. No. 4,527,249

SUMMARY OF THE INVENTION

A computer for implementing an event driven algorithm and used to simulate a digital system or a digital circuit is described. The computer system is comprised of a host unit and an accelerator. The host unit is comprised of a multiple user master processor, such as a 80386 microprocessor chip manufactured by Intel Corporation of Santa Clara, Calif.; a memory; and an interface to the accelerator. The master processor is coupled to various remote users by a networking system, such as Ethernet. The host unit provides the main control of data distribution between the various user and the accelerator.

The accelerator is comprised of a number of modules and the communication between the various modules and the host unit is provided by a unidirectional token ring bus. Each module is comprised of a plurality of processors and each module is capable of providing independent processing of information it stores. Further processors arranged within each module are also capable of providing substantially independent processing.

In a typical situation, a given user will attempt to simulate a large number of circuit components. The master processor of the host unit will distribute the circuit elements to be simulated to various processors located in the modules. The allocation is accomplished to provide approximately equal computation time by each processor such that no one module is burdened with excessive processing requirements.

Prior to each processing cycle, information is passed along the unidirectional ring bus to the various module units in information packets. Each module includes an interface board coupled to the ring bus. The interface board will determine if the received information packet on the ring bus is destined for its module. If the information is not destined for its module then the information is bypassed and transmitted back on the token ring bus. If the information is destined for its module, the interface board, which is termed an event buffer, distributes the information to the appropriate processor. Similarly, if an information packet is to be sent from one of the processors within its given module, the event buffer also controls the acceptance of the information from the processor and distributes the information packet onto the ring bus according to the protocol of the token ring bus.

Once the input information for the various circuit elements are placed in to the various processors, computation of the various inputs associated with the circuit elements are computed for this given time cycle. The results of the computation determine the output from the various circuit elements and these are stored within the processors. The accelerator then is prepared to advance to the next time cycle to utilize the stored outputs as inputs to the next stage of the circuit.

In line with the novel architecture of the present invention, a special hardwired processor is utilized to provide a more rapid streamlined processing of more primitive circuit elements, such as logic gates. The hardwired processor is arranged to provide a pipelined computation of logic gates stored within itself. The hardwired processor accepts input state changes for circuit elements stored within itself and stores this information in a flat queue. The flat queue is then addressed and the input state changes associated with the appropriate circuit element is evaluated using a simulation algorithm for that circuit element. Next, the delay table is accessed to determine the delay of this given circuit element and the result is stored in an event queue. The event queue is later accessed to determine any output changes, which would be transmitted as input state changes to the next circuit stage, and is sent to a fanout pointer and a fanout list to determine the circuit elements which require updating during the next time phase. An output means determines if the next circuit element is on this same processor or if update data is to be transmitted to one of the other processors.

This pipelined architecture permits each pipeline stage to operate substantially independent of other stages such that each is capable of pipelining information as long as the subsequent stage is free to accept the information. The hardwired processor is not programmed by microcode and functions much faster than the microcode programmed simulation processors of the prior art.

Other advantages to the described computer system will be apparent from the following description.

BRIEF DESCRIPTION OF THE DRAWINGS

FIG. 1 is an overall system block diagram showing the architecture of the present invention.

FIG. 2 is an expanded block diagram showing one example of a processor module of the present invention.

FIG. 3 shows data stored in an information packet used with the preferred embodiment.

FIG. 4 shows mapping of a memory associated with processors of the present invention.

FIG. 5 shows a time wheel which is part of the memory of FIG. 4.

FIG. 6 is a circuit block diagram showing the pipelining stages of a hardwired processor of the present invention.

FIG. 7 is a flow diagram of the hardwired processor of FIG. 6.

DETAILED DESCRIPTION OF THE INVENTION

The present invention provides for a computer which implements a simulation algorithm. The computer is utilized in providing computer aided engineering design by simulating various circuit elements, such as logic gates, etc. In the following description, numerous specific details are set forth such as specific number of processors, memory size, word length, etc., in order to provide a thorough understanding of the present invention. It will be obvious, however, to one skilled in the art that the present invention may be practiced without these specific details. In other instances, well-known circuits, structures, and methods have not been described in detail in order not to unnecessarily obscure the present invention. Moreover, while the present invention is described in connection with a particular algorithm for circuit simulation, the apparatus of the present invention, namely the architecture, may be used with other algorithms, even though a particular algorithm is described with the preferred embodiment.

ARCHITECTURE

Referring to FIG. 1, a computer system 18 of the present invention is shown comprised of two sections, main processor section 19 and an accelerator 20. Main processor section 19 is comprised of a host unit 21, a user bus 14 and a plurality of designated users numbered 1, 2, and 3. Although only three users are shown in FIG. 1, many more users can be coupled to the user bus 14 for accessing host unit 21. Further, although multiple users are shown in FIG. 1, a single user system can be implemented with the computer system of the present invention. User bus 14 is a bidirectional bus transferring information between the various users and the host unit 21. The preferred embodiment uses a networking bus architecture, which is well known in the art as Ethernet, for user bus 14.

Host unit 21 includes a main processor 15, memory 16, and an Accelerator Interface Processor (AIP) 17. The processor 15 of the present invention is a multiple user/multiple-tasking microprocessor based device and the particular processor used with the preferred embodiment is the 80386 integrated circuit microprocessor manufactured by Intel Corporation of Santa Clara, Calif. Processor 15 is coupled to the various users through the Ethernet network of user bus 14. Processor 15 also provides the multi-tasking which permits each user to access Processor 15 without the concern of interfering or being interfered by other users.

Memory 16 of host unit 21 is coupled to the processor 15 and AIP 17, and provides the necessary storage of data which is accessed by processor 15 and AIP 17. Memory 16 may be comprised of any of a variety of prior art memories, however, the preferred embodiment uses 8 megabytes of random access memory (RAM) and a hard disk. AIP 17 is a high speed device for providing direct memory access (DMA) between host unit 21 and accelerator 20. AIP 17 of the preferred embodiment is capable of transferring data at a maximum rate of 30 megabytes per second to or from the accelerator 20.

As used in the preferred embodiment, the host unit 21 is physically located in the same equipment assembly as accelerator 20. However, the users are physically located at a distance from the host unit 21 and the accelerator 20, and the users use a remote system for their simulation. The user bus 14, which is part of the Ethernet network, provides remote networking to couple the various users to host unit 21 which is also on the Ethernet network.

The accelerator 20 is a multiple processor accelerator and in the configuration of the preferred embodiment is capable of having a maximum of 254 processors; however, such limitation being a design choice and not a limitation of the present invention. The accelerator 20 is comprised of at least one module 22 and a unidirectional ring bus 23. Each module 22 is designed for configuring from 1 to 12 processors within itself. However, again such number being a design choice and not a limitation. Ring bus 23 is a unidirectional bus for serially coupling host unit 21 to the various modules 22 of accelerator 20. Although a variety of unidirectional buses can be utilized for transporting data between the various modules 22 and the host unit 21, the preferred embodiment utilizes a token ring bus system, wherein information is passed between the various units by a method of transferring a token along ring bus 23. One of a variety of prior art token ring bus schemes can be utilized to provide the protocal for transferring information unidirectionally on ring bus 23.

Each module 22 is capable of containing from 1 to 12 processors. However, the maximum number of processors which may exist within accelerator 20 is limited to 254 for the configuration as used in the preferred embodiment. Any combination of processors may be placed in these various modules 22, as long as the maximum is not exceeded. Therefore, if one processor is placed in each module 22, then 254 modules would be required if all 254 processors are used. However, in most simulation applications only a fraction of the maximum allowable 254 processors will be needed. Typically, a total required number of processors is first calculated and these are distributed into module groupings for optimum speed. For example, a system requiring eight processors will be distributed into two modules of four processors each. As will be shown later, each module 22 will be comprised of a number of processors and a given module 22 will operate independently from every other module 22, such that each module 22 is capable of providing parallel processing from every other module 22.

In functional terms, accelerator 20 is comprised of a plurality of modules 22, wherein each module 22 is capable of containing from 1 to 12 processors. Communication between the various modules 22 and the host unit 21 is provided by the ring bus 23.

A packet of information is sent on ring bus 23 from host unit 17 or one of the modules 22. The packet is given a destination address and this packet is transferred unidirectionally on ring bus 23 until the destination device is reached. Although only one packet of information can be on the bus 23 at any given instant, each device 21 or 22 is capable of independently processing information stored in itself.

Therefore, while a packet is being circulated to its destination on ring bus 23, each device 21 or 22 is providing simultaneous processing of information stored in itself. Further, while the simultaneous processing is occurring, data is put into packets for interdevice transfer on ring bus 23 as the token ring protocol will permit. It is to be stressed that although single data transfer on ring bus 23 is possible, a preferred method is to use packets of data to allow for a more timely transfer of information.

Referring to FIG. 2, a typical module 22, having a certain pre-defined hypothetical configuration, is shown and designated as module N. For each module 22, twelve slots are allocated for various processing devices and the slots are provided with a slot number to designate the actual physical location of the slot for plugging in various circuit cards.

For each module 22, an event buffer (EVB) 30 board is configured in one of the slots. In FIG. 2 EVB 30 is located within Slot 1. The purpose of the EVB 30 is to speed the event storage in the simulator without the requirement of accessing the memory 16 or other modules 22 frequently in the middle of a simulation to obtain data. The EVB 30 includes 8 megabytes of RAM and is necessary for the interfacing of each module 22 to ring bus 23. The other slots, 2–12, are comprised of one of the processors mentioned in reference to FIG. 1 and discussed below or a specialized simulation device which operates in conjunction with one of the processors.

Two types of processors are configured to operate with the module 22 of the present invention. A software processor (SP) 31 and a hardwired processor (HP) 32 are the two types available with the accelerator 20 of the present invention. An interprocessor bus (IP bus) 33 couples the various SP and HP processors 31 and 32 to the EVB 30. Although the number of actual physical circuit boards utilized with each processor unit within Module 22 is up to the preference of the designer, the present invention uses a single circuit board for SP 31 and two circuit boards for HP 32. Each board physically occupies one slot, however, in the electrical connection of HP 32, only one slot connection is needed to IP bus 33.

In the example of FIG. 2, an SP 31 in slot 12 is shown coupled to a specialized device known as a Physical Modeling Extension (PMX) 34 board to provide a physical reference element for simulation when used in conjunction with the SP 31 in slot 12. Although a variety of PMX 34 units can be utilized, one such PMX is described in application Ser. No. 651,427, filed Sept. 17, 1984, entitled Physical Modelling Device For Use With Computer-Aided Design, and assigned to the assignee of the present invention.

Information from the host unit 21, which may include information received from users on user bus 14, is transferred to the various modules in packets transmitted on ring bus 23. For example, in a three module system shown in FIG. 1, for a packet of information to be sent from host unit 21 to module C, the packet must be transferred through modules A and B before it is passed onto module C. Packets may originate from one module and be destined for another. For example, information originating from module A and destined for module C will pass through module B. Because of the unidirectional nature of ring bus 23, information originating from module C and destined for module A will be transferred through AIP 17. In this instance, AIP 17 will function to bypass the packet from module C for destination to module A. As used in the preferred embodiment the ring bus protocol permits only one packet to be on the ring bus 23 at any given time.

During the initialization phase, when the host unit 21 is activated prior to performing any simulation algorithm, host unit 21 will interrogate various modules 22 to determine the extent of the processor cards physically affixed to each of the modules 22. After interrogating each potential slot for each module, host unit 21 will designate a logical address for each of the active slots of each module 22 of accelerator 20. That is, logical addresses will not be given to any empty card slots of any module and different logical addresses will be given to similar slot numbers of two different modules so that each card or device coupled to a slot of a given module is given a unique address within accelerator 20. The logical address information is stored within memory 16 of host unit 21.

Once the initial configuration has been achieved, the host unit 21 will accept input from various users on user bus 14. The input from User No. 1 is allocated to the various processors in Accelerator 20. The allocation management function is provided by the host unit 21 such that the simulation being run by a particular user is distributed optimally to all the appropriate processors in accelerator 20. For example, if an algorithm to simulate a circuit element requires the use of HPs 32, then the host unit 21 will distribute the circuit elements to be simulated substantially equally to all of the HPs 32 in accelerator 20. Circuit elements which cannot be handled by the HP 32 are distributed to the SPs 31, and the algorithm requiring a special device such as PMX 34, is allocated to the special device or to the associated SP 31 operating in conjunction with the special device.

The SP 31 of the present invention is comprised of a memory, a processor (ALU) and a micro-code addressing means to provide a software simulation of the task at hand. One such implementation of an event driven simulation algorithm as implemented in the SP 31 is disclosed in U.S. patent application Ser. No. 594,533, filed Mar. 28, 1984, and entitled Digital Computer for Implementing Event Driven Simulation Algorithm, which is assigned to the assignee of the present invention. However, because of the microcode processor architecture of the SP 31, the SPs 31 operates at a much slower speed than the HPs 32. The SPs 31 of the preferred embodiment have three megabytes of onboard RAM which permit the SPs to simulate approximately 12 million bits of ROM or 6 million bits RAM. The SPs 31 are capable of simulating complex circuit components such as ROMs, RAMs, PLAs, BXFRs, DABLs, and PMXs. However, because the architecture of the SPs 31 and its associated algorithm are designed to simulate complex circuit components, it requires substantially more processing time to provide the simulation.

The HPs 32 of the present invention are designed to provide faster processing for simulation of simpler circuit components. Analysis of circuit simulation systems have shown that typically 95 percent of the elements in a circuit design simulation fall within the category of simple circuit components such as gates, flip-flops and delay circuits. The remaining 5 percent fall within the more complex circuit component category such as ROMs, RAMs, PLAs, BXFRs, DABLs, and PMXs, which are simulated by the SPs 31 of the present invention as described above. The HPs 32 of the present invention is capable of simulating simple gates having five inputs or less, tri-state gates having 5 inputs or less, flip-flops, UXFRs, and delay components. Because a significant percentage of the circuit components fall within the primitive category, the HPs 32 are capable of simulating these simpler components at a much faster processing speed than that of the more complex elements which are handled by the slower processing SPs 31.

Each HP 32 of the preferred embodiment, due to its pipelined architecture, is capable of simulating 64,000 gates. On the other hand, each micro codable SP 31 of the preferred embodiment is capable of simulating only 16,000 gates. The actual number of HPs 32 and SPs 31 within a given module 22 is left to the design choice of the designer. However, it has been determined through reduction to practice, that an optimum configuration results when equal number of SPs 31 and HPs 32 are present within a given module 22.

Still referring to FIG. 2, information transfer occurs external to modules N on ring bus 23. Packets of information are transmitted on ring bus 23 from other modules 22 or host unit 21 of FIG. 1 and are received by an input register 37, of EVB 30 of a given Module N. If the received data is destined for other than module N, the information is passed to bypass register 38 and then to output register 39 for further transmission on ring bus 23. However, if the data received is destined to this given module N, then the information is passed to input FIFO 40. FIFO 40 stores the information until IP bus 33 is free to receive the stored information. The information stored within FIFO 40 is then distributed onto IP bus 33 for final distribution to one of the 11 remaining slots coupled to IP bus 33.

For transmitting information from one of the processors coupled to IP bus 33, the information is transmitted from the appropriate processor onto IP bus 33. If the destination of the information is within module N, then the data is accepted in an intra-module transfer. Simply, the destination processor receives the information placed on IP bus 33.

However, when the destination is outside of module N, an inter-module transfer must occur. Data placed on the IP bus 33 is stored within FIFO 41 of EVB 30. When module N has access to ring bus 23, data is passed from FIFO 41 to output register 39 and onto ring bus 23.

A primary function of EVB 30 is to provide the necessary arbitration for both the ring bus 23 and its associated IP bus 33. The accessing of ring bus 23 and the transference of data packets between various modules have been described earlier. The IP bus 33 arbitration for each module 22 is also accomplished by the EVB 30. In this instance, a look-up table 42 is hard-wired coupled to each of the processors 31 and 32 within its same module 22 by request lines 44. The request lines 44 are basically utilized to function as interrupt lines.

When the EVB 30 is transferring information from FIFO 40 to one of the processors 31 or 32, the EVB 30 will take control of the IP bus 33 for transmitting data from FIFO 40 to its respective processor 31 or 32. When one of the processors requires access to the IP bus 33, that processor generates a request signal on its applicable request line 44 and that signal is received by the look-up table 42. Table 42 is used to determine which processor has requested access of the IP bus 33 and if the IP bus 33 is free, EVB 30 permits the requesting processor to access IP bus 33. The processor which has accessed IP bus 33 will then transfer information onto IP bus 33 for transmission to one of the other processors located in one of the other slots coupled to IP bus 33, or to the output FIFO 41 for transmission of data onto ring bus 23.

By achieving IP bus 33 arbitration, each processor within a given module 22 is capable of transferring information to another processor within the same module or in the alternative, passing the information to the EVB 30 for eventual transmission onto ring bus 23. Equivalently, incoming data on ring bus 23 is controlled by EVB 30 for arbitration onto IP bus 33 for distribution to the appropriate processor. It is appreciated that the EVB 30 permits independent operation of ring bus 23 and IP bus 33. That is, one set of data can be transmitted on the IP bus 33 while a different set of data is being transmitted or transferred on the ring bus 23, wherein both of these operations can occur simultaneously.

An IP hold circuit 45 within EVB 30 is coupled to the processors 31 and 32 of its same module through IP hold line 46. The purpose of the hold line 46 is to prevent a lock-up condition from occurring. A lock-up condition can occur when two processors, each in a different module, are transferring information to each other through its respective EVB on ring bus 23. For example, if HP 32 of slot 4 of module N accesses IP bus 33 for loading FIFO 41 for transmission onto ring bus 23, the slot 4 HP 32 will continue to hold IP bus 33 for transferring data to FIFO 41. However, if the second processor in the different module is transmitting on ring bus 23 and the destination is to the slot 4 HP 32, then the data will be coupled as input to FIFO 40. However, FIFO 40 cannot access IP bus 33 for further transfer of data, because slot 4 HP 32 is still controlling IP bus 33 for its transmission purpose. In this instance, FIFO 41 cannot access ring bus 23 for transmission of its packet and FIFO 40 cannot access IP bus 33 due to the control exerted by the slot 4 HP 32.

If the packet being transmitted on ring bus 33 to FIFO 40 is lengthy, then the transmitting processor will not free ring bus 23, so that FIFO 41 can access ring bus 23 for its transmission. In this instance a lock-up condition will occur, wherein FIFO 41 cannot release information onto ring bus 23 because of the non-idle state of ring bus 23, and at the same time ring bus 23 cannot transition to an idle state because information cannot be completely removed from ring bus 23 due to the blockage occurring at FIFO 40. To overcome this lock-up condition, hold circuit 45 will detect when this lock-up condition occurs. Hold circuit 45 will generate a signal on hold line 46 to cause all processors coupled to the IP bus 33 to revert to a listen mode. Once in the listen mode, slot 4 HP 32 will free IP bus 33 and permit information from FIFO 40 to be released to it. This will free ring bus 23 permitting FIFO 41 to transmit data onto ring bus 23. Once the lock-up condition has cleared, slot 4 HP 32 can now regain access to IP bus 33 for transmission of data to FIFO 41.

The host unit 21 does not include an EVB 30 or an IP bus 33 as shown in FIG. 2. However, AIP 17 of host unit 21 includes equivalent means for permitting data to be passed to and from ring bus 23 and is treated equivalently as one of the modules for data transfer to and from the ring bus.

The simulator of the present invention is an event-driven simulator, wherein an event is defined as a change in the output state of a circuit element, such as a gate, which will happen sometime in the future. A simulator which implements such an event-driven algorithm for determining the performance of simulated gates is disclosed in the aforementioned U.S. patent application Ser. No. 594,533.

FIG. 3 shows a double-word format which represents a packet of data of the preferred embodiment for updating the events and the state of various gates stored in the system. The most significant 8 bits of the first word 51 of packet 50 provide the eight-bit logical address number of the destination processor. The remaining 16 bits of the first word 51 provide a unique gate number associated with a particular gate stored within that processor. The most significant 8 bits of the second word 52 contain the new state information for that gate number. The least significant 16 bits of second word 52 contain the information as to which input of the gate the new state applies to. Therefore, when an event changes for a given gate, packet 50 provides the state change for an input of the given gate; and for each input event change, a unique packet 50 is generated. As described earlier, the processor containing that particular gate number can be located within the same module or in the alternative it can be located in a separate module. Because of the unique logical addressing scheme, the processor number of each packet 50 determines the destination of the information contained in that packet 50.

Referring to FIG. 4, a memory 56 allocated to each processor 31 and 32 of accelerator 20 is shown in a mapped form. Memory 56 is comprised of user section 57 and time wheel section 58. User section 57 is mapped to allocate memory space for each user 1-m. The segmentation of section 57 permits multiple user access of accelerator 20 by storing a portion of each user's simulation data in each memory 56. However, the time wheel segment 58 is not segmented for each user. Although segmentation can be achieved for designating the timing sequence for simulating each user program, the preferred embodiment utilizes a single time wheel 58 for each processor within accelerator 20.

The host unit 21 of FIG. 1 maintains master control of the time wheel segment 58 for each memory 56. Memory 16 of host unit 21 of FIG. 1 stores the time wheel information for each user coupled to host unit 21. However, host unit 21 does load all of the simulation data in segment 57 for all users coupled to host unit 21.

In operation, when User 1 program is to be run, host unit 21 loads the time wheel 58 of each memory 56 with information relating to the timing of the program associated with User 1. When User 2 is to obtain access, host unit 21 will unload the contents of time wheel 58 from each memory 56 and stores this information in memory 16 of host unit 21. Then, host unit 21 will load time wheel 58 with timing information for User 2. Once the time wheel information for User 2 has been loaded in each memory 56, then User 2 area of segment 57 is accessed for running the User 2 simulation. Therefore, the contents of time wheel 58 are unloaded and loaded each time a different user program is to run.

Referring to FIG. 5, an expanded example of the time wheel 58 of FIG. 4 is shown. The hypothetical example of FIG. 5 shows a particular time wheel 58a. Time wheel 58a contains event information for a particular gate only if a state is to change. Assuming that state change to a given gate occurs at time t, time wheel 58a will determine which gate or gates are affected at time t. Each time period change, referred to as a time tick, will continue until the next event change occurs for one of the gates stored within a particular memory 58a. In the example of FIG. 5, this second event change occurs at time t+15. Because several gates can be affected at a given time tick, each time tick in Time Wheel 58 is linked together through a double link list known as an event queue. In this particular example three gates are affected at time t+15 and are shown as gates 36, 43 and 53.

Therefore, time wheel 58a for a given user program stores information pertaining to event changes occurring to gates which are being stored in its associated user segment 57 of memory 56. Further, in the preferred embodiment, the contents of an event for a time tick for a given gate is actually the information represented as packet 50 in FIG. 3.

HARDWIRED PROCESSOR

FIG. 6 is an expanded block diagram schematic showing elements for pipelining information through each HP 32 of a given module 22 shown in FIG. 2. The HP 32 is physically divided into two boards 61 and 62, shown by dotted line 60. The HP 32 of the preferred embodiment is a hardwired logic simulation board (actually two boards) providing a 9 stage pipeline machine for processing the more primitive circuit components as described earlier. The hardware configuration of HP 32 is to provide serial pipelining of various functions of the simulation through the stages 1-9. That is, information entering stage 1 will transition to stage 2 and then to stage 3 and etc. until it completes its pipelining at stage 9.

Also referring to FIG. 7, it illustrates the pipelining sequence for performing the simulation in a flow diagram. The pipelining sequence is comprised of an update phase and an evaluation phase. The two phases of the simulation activate different data flows in the pipeline of FIG. 6.

During the update phase, the HP 32 performs dual tasks. The first task is performed by the input evaluation bit logic 71, shown as stage 1, wherein information received from other processors are inputted from the IP bus 33 to stage 1 of HP 32. The evaluation bit logic 71 receives fanout packets which are sent to this particular processor and updates the input states of the gates and puts the gate numbers in the flat queue 72 of stage 2. A gate number is put in a flat queue if not present already.

The second task of HP 32 during the update phase is being performed by the event queue 76 of stage 6. The time wheel 76a, which is equivalent to time wheel 58a of FIG. 5, will select gates from the event queue 76 if an event has occurred for this given time tick. The event queue 6 will address a fanout pointer from fanout pointer 77 of stage 7 for each of the gates sent from the event queue 76. The fanout pointer 77 will then address the appropriate fanout information from fanout list 78 of stage 8. The fanout list 78 is basically a cross reference table for providing a type of fanout which pertains to the type of gate selected.

Fanout pointer 77 is utilized so that the gate selection from the event queue 76 need to address a single pointer, wherein this pointer will point to a particular type of gate stored within fanout list 78. By utilizing this fanout list, a particular fanout need only be stored once in the fanout list 78 and multiple selection can be achieved by pointers from fanout pointer 77. The fanout information is sent to stage 9 wherein one of two conditions will occur. Stage 9 includes an identification comparator 79 which looks at the destination of the fanout information. If the fanout (destination) gate is on the same HP boards 61 and 62, then that information is passed to stage 1. However, if the destination of the fanout gate is on another processor, then the information is stored in the output FIFO of stage 9 and will later be sent on the IP bus 33 when this HP 32 acquires IP bus 33 for transmission of data.

During the evaluation phase, stages 2, 3, 4, 5 and 6 are active. The flat queue 72 takes gate data out of the flat queue, along with gate input information. Gate type stage 73 of stage 3 finds the gate type and the evaluation pointer for that particular gate. The evaluation process occurs in stage 4 wherein the evaluation stage 74 performs a lookup of simulation algorithms stored in a memory 174 according to the evaluation pointer and a current state of the inputs for that gate. Then at stage 5 the delay table 75 is accessed to determine the rising or the falling delay for that given gate according to the evaluated output from stage 4. The event queue 76 of stage 6 then compares the old and evaluated outputs and schedules an event and stores that in the event queue 76 if the two comparisons do not agree, signifying a state change.

Each pipeline stage in the HP 32 is 400 nsec. long. The exception to this is the event queue 76 which can sometimes generate 500 nsec. cycles. The HP 32 also includes an evaluation counter that counts the number of evaluations that occurs and the HP 32 is capable of reaching 1.75 million evaluations per second under optimum conditions. This will require that all of the pipeline stages, Stages 1-9, be busy most of the time.

Separate memory units are utilized for storing information for each of the stages 2, 3, 4, 5, 6, 7 and 8.

A master control 65 is coupled to the different stages to permit the transfer of information from one stage to the next. The master control 65 is configured such that information can be pipelined at different rates. For example, if the evaluation algorithm in stage 4 causes a clog in the pipelining system, master control 65 will cause gate type stage 73 to stop sending information to stage 4 until the pipelining opens again. However, the master control 65 will continue to allow other stages to function as long as the next stage in the pipeline is capable of receiving information. Therefore, master control 65 permits each stage to operate independently in processing information, but will prevent the transfer of information if a clog occurs in the pipeline.

The SP 31 of the preferred embodiment is a 10 MHz microcodable processor with 3 megabytes of onboard memory. It simulates more complex elements which cannot be simulated by the HP 32. To reach maximum simulation speed, parallelism of execution should be achieved among the various processors. This requires that the amount of time it takes the SP to process a time tick, should be the same as a that of the HP. This fact and the internal memory size of each of the SPs will put a limiting factor in the number of gates that an SP should simulate.

The hardwired processor of the preferred embodiment is designed to have a typical capacity of 64K gates. Assuming that on the average 0.2% of the gates are scheduled at every time tick, at an average speed of 500,000 events per second, each average time tick will take 256 microseconds. The SP can perform at an average of 30,000 events per second which means that in 256 microseconds the SP can process 8 events. Therefore, an equivalent capacity of the SP will be around 4K gates versus 64K for the HP. But since most of the simulated elements in the SP are of a type involve duplication in the gate attribute structure, a 16K gate capacity for the SP is more realistic.

It is to be appreciated that the size of the memory of the various processors is a matter of design choice and a specific size is stated for exemplary purpose only.

Thus a computer which utilizes a hardwired pipelined processor for implementing an event driven simulation algorithm is described.

I claim:

1. A processor for implementing an event driving algorithm for simulating circuit elements, including a first circuit element having a first input state and a first output state, by serially pipelining data from one means to a subsequent means of the processor, comprising:
   (1) means for updating the first input state of the first circuit element to a second input state;
   (2) means for storing circuit element data, including storing (a) a number associated with the first circuit element, wherein the number can be received from the means for updating, and storing (b) the second input state received from the means for updating;
   (3) means for receiving circuit element data from the means for storing circuit element data and for retrieving (a) circuit element type information associated with the first circuit element and (b) a pointer for the first circuit element;
   (4) a first memory for storing a simulation algorithm according to the pointer;
   (5) evaluation means for locking up an output state for the first circuit element determined by (a) the simulation algorithm stored in the first memory according to the pointer received from the means for retrieving a circuit element pointer and (b) the second input state of the first circuit element received from the means for storing circuit element data;

(6) means for scheduling and storing an event signifying that an output state change is required if the output state received from the evaluation means is different from the first output state of the first circuit element;

(7) control means for controlling the flow of data among the means for updating, the means for storing circuit element data, the means for retrieving circuit element type information and a pointer, the evaluation means, and the means for scheduling and storing an event.

2. The processor of claim 1, further comprising means for determining time delay information for the output of the first circuit element received from the evaluation means and for sensing the time delay information to the means for scheduling and storing an event, the flow of data to and from the means for determining time delay information being controlled by the control means.

3. The processor of claim 2, wherein:
(1) the means for updating comprises an evaluation bit logic state;
(2) the means for storing circuit element data comprises a flat queue stage coupled to the evaluation bit logic stage;
(3) the means for receiving circuit element data and for retrieving circuit element type information and a pointer comprises a gate type stage coupled to the flat queue stage;
(4) the evaluation means comprises an evaluation stage coupled to the gate type stage and the first memory;
(5) the means for scheduling and storing an event comprises an event queue stage coupled to the evaluation stage;
(6) the means for determining time delay information comprises a time delay table stage having an input coupled to the evaluation stage and an output coupled to the event queue stage; and
(7) the control means comprises control circuitry coupled to the evaluation bit logic stage, the flat queue stage, the gate type stage, the evaluation stage, the delay table stage, and the event queue stage.

4. A processor for implementing an event driven simulation algorithm to simulate circuit elements having initial input and output states in a more streamlined fashion by partitioning simulation solving functions in a serially pipelined architecture, comprising:
(1) means for updating the initial input states of the circuit elements;
(2) means for storing circuit element data, including storing (a) numbers associated with the circuit elements, wherein the numbers can be received from the means for updating, and storing (b) the updated input states received from the means for updating;
(3) means for receiving circuit elements data from the means for storing circuit element data and for retrieving (a) circuit element type information associated with the circuit elements and (b) pointers for the circuit elements;
(4) a first memory for storing simulation algorithms according to the pointers;
(5) evaluation means for looking up output states for the circuit elements determined by (a) the simulation algorithms stored in the first memory according to the pointers received from the means for finding circuit elements pointers and (b) the updated input states of the circuit elements received from the means for storing circuit element data;
(6) means for determining time delay information for the outputs of the circuit elements received from the evaluation means;
(7) means for (a) receiving the time delay information from the means for determining time delay information and for (b) scheduling and storing events signifying that output state changes are required if the output states received from the evaluation means are different from the initial output states of the circuit elements;
(8) control means for controlling the pipelined flow of data among the means for updating, the means storing circuit element data, the means for retrieving circuit element type information and pointers, the evaluation means, the means for determining time delay information, and the means for receiving the time delay information and for scheduling and storing events.

5. The processor of claim 4, wherein the control means allows information to be pipelined at different rates between the various serially pipe-lined means for the processor.

6. The processor of claim 5, wherein each of the circuit elements has a plurality of inputs.

7. The processor of claim 5, wherein:
(1) the means for updating comprises an evaluation bit logic stage;
(2) the means for storing circuit element data comprises a flat queue stage coupled to the evaluation bit stage;
(3) the means for receiving circuit element data and for retrieving circuit element type information and pointers comprises a gate type stage coupled to the flat queue stage;
(4) the evaluation means comprises an evaluation stage coupled to the gate type stage and the first memory;
(5) the means for determining time delay information comprises a delay take stage having an input coupled to the evaluation stage and an output coupled to the means for receiving the time delay information and for scheduling and storing events;
(6) the means for receiving time delay information and for scheduling and storing events comprises an event queue stage coupled to the evaluation stage;
(7) the control means comprises control circuitry coupled to the evaluation bit logic stage, the flat queue stage, the gate type stage, the evaluation stage, the delay table stage, and the event queue stage.

* * * * *